(12) United States Patent
Grabon et al.

(10) Patent No.: US 12,484,194 B2
(45) Date of Patent: Nov. 25, 2025

(54) MODULAR COOLING SYSTEM

(71) Applicant: Carrier Corporation, Palm Beach Gardens, FL (US)

(72) Inventors: Michel Grabon, Montluel (FR); Aritz Calvo, Montluel (FR); Geoffrey Lutz, Montluel (FR)

(73) Assignee: CARRIER CORPORATION, Palm Beach Gardens, FL (US)

( * ) Notice: Subject to any disclaimer, the term of this patent is extended or adjusted under 35 U.S.C. 154(b) by 274 days.

(21) Appl. No.: 18/342,798

(22) Filed: Jun. 28, 2023

(65) Prior Publication Data

US 2024/0008225 A1 Jan. 4, 2024

(30) Foreign Application Priority Data

Jun. 29, 2022 (EP) ..................... 22182013

(51) Int. Cl.
*H05K 7/20* (2006.01)

(52) U.S. Cl.
CPC ..... *H05K 7/20327* (2013.01); *H05K 7/20354* (2013.01); *H05K 7/20827* (2013.01); *H05K 7/20836* (2013.01)

(58) Field of Classification Search
CPC .......... H05K 7/20327; H05K 7/20354; H05K 7/20827; H05K 7/20836
See application file for complete search history.

(56) References Cited

U.S. PATENT DOCUMENTS

| | | |
|---|---|---|
| 9,885,503 B2 | 2/2018 | Kopko |
| 10,119,717 B2 | 11/2018 | Matsuo et al. |
| 11,022,349 B2 | 6/2021 | Perrotin |
| 11,240,937 B2 | 2/2022 | Marchetti |
| 2019/0293326 A1 | 9/2019 | Chamoun |
| 2021/0123650 A1 | 4/2021 | Mukaitani et al. |

(Continued)

FOREIGN PATENT DOCUMENTS

| | | |
|---|---|---|
| CN | 202209744 U | 5/2012 |
| CN | 203797788 U | 8/2014 |

(Continued)

OTHER PUBLICATIONS

Extended European Search Report received for EP Application No. 22182013.7, mailed on Dec. 6, 2022, 11 Pages.

*Primary Examiner* — Lionel Nouketcha

(74) *Attorney, Agent, or Firm* — Drew Folgmann

(57) ABSTRACT

A modular cooling system comprising a plurality of chiller modules and a coolant circuit with flow paths having parts in each of the plurality of chiller modules. The coolant circuit cools a working fluid to meet a cooling demand, and the working fluid can be cooled in heat exchange with the heat absorbing heat exchangers of the free cooling circuits and heat exchange with the heat absorbing heat exchangers of the refrigeration circuits. The flow paths of the coolant circuit connect to the heat absorbing heat exchangers of the free cooling circuits in parallel and connect to the heat absorbing heat exchangers of the refrigeration circuits in series. The coolant circuit flow paths split along parallel flows through the heat absorbing heat exchangers of the free cooling circuits before recombining to flow sequentially in a combined flow path through the heat absorbing heat exchangers of the refrigeration circuits.

20 Claims, 2 Drawing Sheets

(56) References Cited

U.S. PATENT DOCUMENTS

2021/0247118 A1 8/2021 Yamano et al.
2021/0285663 A1 9/2021 Grabon

FOREIGN PATENT DOCUMENTS

| CN | 204313387 U | | 5/2015 | |
|----|-------------|---|--------|---|
| CN | 204478571 U | | 7/2015 | |
| CN | 205538262 U | | 8/2016 | |
| CN | 206743754 U | | 12/2017 | |
| CN | 112178872 A | * | 1/2021 | ............ F24F 11/46 |
| EP | 1149262 B1 | | 9/2005 | |
| EP | 3760951 B1 | | 4/2022 | |
| JP | 4829147 B2 | | 12/2011 | |
| JP | 5263840 B2 | | 8/2013 | |
| WO | 2017160346 A1 | | 9/2017 | |

* cited by examiner

MODULAR COOLING SYSTEM

CROSS REFERENCE TO RELATED APPLICATIONS

This application claims priority to EP patent application Ser. No. 22/182,013.7 filed on Jun. 29, 2022.

BACKGROUND

The disclosure relates to a modular cooling system and to a method for cooling using a modular cooling system.

Cooling systems are known for various purposes, such as for cooling of data center. Such cooling systems can use one or more refrigeration circuits to provide mechanical cooling. It is also known to supplement or replace mechanical cooling with free cooling, e.g. by cooling of a coolant fluid in heat exchange with outside air. Some systems use a separate free cooling circuit with a low temperature coolant fluid such as glycol, which then exchanges heat with a water circuit that is used for providing cooling within a building, e.g. for a data center.

It is also known to use multiple refrigeration circuits and/or free cooling circuits in parallel in a modular arrangement in order to increase the cooling capacity. With a modular system it becomes possible to add or reduce the maximum cooling capacity by installing or removing such chiller modules. In addition, the cooling provided can be adjusted by activating or deactivating one or more of such parallel modules.

SUMMARY

Disclosed herein is a modular cooling system comprising a plurality of chiller modules. Each chiller module includes a refrigeration circuit and a free cooling circuit. Each refrigeration circuit comprises a compressor, a heat rejecting heat exchanger, an expansion device and a heat absorbing heat exchanger. Each free cooling circuit comprises a pump, a heat rejecting heat exchanger and a heat absorbing heat exchanger; and a coolant circuit for cooling a working fluid to meet a cooling demand. The coolant circuit also includes flow paths having parts in each of the plurality of chiller modules whereby the working fluid can be cooled in heat exchange with the heat absorbing heat exchangers of the free cooling circuits and heat exchange with the heat absorbing heat exchangers of the refrigeration circuits. The flow paths of the coolant circuit are arranged to connect the heat absorbing heat exchangers of the free cooling circuits in parallel and to connect the heat absorbing heat exchangers of the refrigeration circuits in series, such that the coolant circuit flow paths split along parallel flows through the heat absorbing heat exchangers of the free cooling circuits before recombining to flow sequentially through the heat absorbing heat exchangers of the refrigeration circuits.

DETAILED DESCRIPTION

Figure 1:
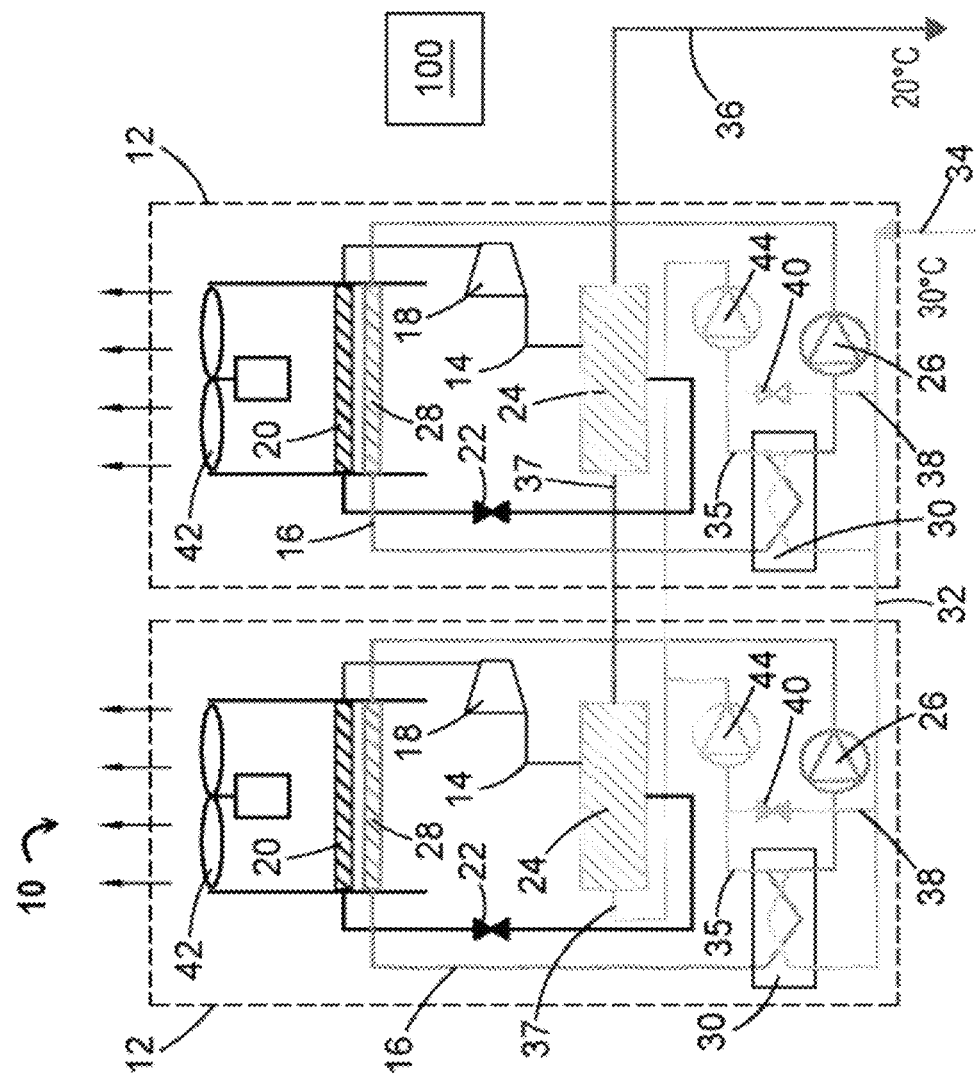
FIG. 1 shows a first modular cooling system with two chiller modules.

Disclosed herein is a modular cooling system comprising a plurality of chiller modules. Each chiller module includes a refrigeration circuit and a free cooling circuit. Each refrigeration circuit comprises a compressor, a heat rejecting heat exchanger, an expansion device and a heat absorbing heat exchanger. Each free cooling circuit comprises a pump, a heat rejecting heat exchanger and a heat absorbing heat exchanger; and a coolant circuit for cooling a working fluid to meet a cooling demand. The coolant circuit also includes flow paths having parts in each of the plurality of chiller modules whereby the working fluid can be cooled in heat exchange with the heat absorbing heat exchangers of the free cooling circuits and heat exchange with the heat absorbing heat exchangers of the refrigeration circuits. The flow paths of the coolant circuit are arranged to connect the heat absorbing heat exchangers of the free cooling circuits in parallel and to connect the heat absorbing heat exchangers of the refrigeration circuits in series, such that the coolant circuit flow paths split along parallel flows through the heat absorbing heat exchangers of the free cooling circuits before recombining to flow sequentially through the heat absorbing heat exchangers of the refrigeration circuits.

With this modular arrangement it becomes possible to increase flexibility and efficiency during use of the cooling system as well as during initial design and installation. At the installation stage the number of chiller modules can be increased or decreased as required to meet a required cooling load, such as to satisfy a peak cooling demand for a data center. Further, if cooling demand increases or decreases in future then modules can be added or removed. During use of the system then it becomes possible to provide cooling from each chiller module by free cooling alone, by mechanical cooling alone, or by a combination of free cooling and mechanical cooling. Different chiller modules could be controlled to provide cooling in different ways to maximise efficiency for a given cooling load taken in conjunction with other system parameters, such as variations in outside air temperature in the case where some or all of the heat rejecting heat exchangers reject heat to outside air. It also becomes possible to provide increased overall efficiency by the proposed series and parallel flow paths, compared to a fully parallel arrangement, since the efficiency for a set of entirely parallel chiller modules is identical to the efficiency of a single of those chiller modules, whereas by using the series interconnection proposed herein the efficiency of multiple chiller modules may be greater than that of a single module.

Each chiller module of the plurality of chiller modules has a free cooling circuit and a refrigeration circuit. It will be appreciated that there may be any number of such chiller modules, such as three or more chiller modules, four or more chiller modules, or five or more chiller modules for example. The plurality of chiller modules may also be used alongside other cooling devices, such as added devices using mechanical cooling only, or free cooling only. The chiller modules may for example be designated as a first chiller module, second chiller module, third chiller module and so on, in which case one can refer also to a corresponding first free cooling circuit, first refrigeration circuit, second free cooling circuit, second refrigeration circuit, third free cooling circuit, third refrigeration circuit and so on. In the example of two chiller modules then the coolant circuit has flow paths allowing for flow in parallel through the heat absorbing heat exchangers of the first and second free cooling circuits, before the flow recombines and passes in series through the heat absorbing heat exchanger of the first refrigeration circuit then the heat absorbing heat exchanger of the second refrigeration circuit. It will be appreciated that this terminology can be similarly applied with a third chiller module, or further added chiller modules.

The modular cooling system has a coolant circuit with flow paths that can interact in a heat exchange relationship with all of the chiller modules. Depending on the required cooling there may be heat exchange with some or all of the heat absorbing heat exchangers in the various free cooling circuits and refrigeration circuits. In some instances it will of course be the case that one or more refrigeration circuit(s) are inactive, e.g. with compressors turned off, so that there is no cooling in the respective heat exchangers. In other instances one or more of the free cooling circuits may not provide any cooling. The flow paths of the coolant circuit may include a bypass for one or more of the free cooling circuit heat absorbing heat exchangers, optionally with each chiller module having a respective bypass. The bypass(es) can permit the working fluid of the coolant circuit to bypass the respective free cooling circuit heat absorbing heat exchanger. This adds to the degree of control for the coolant circuit and can allow for increased efficiency, e.g. when free cooling is not available. In configurations using a bypass then this may be controlled using one or more valves, such as a bypass valve on a bypass line, or a three-way valve connecting between an inlet flow path, a flow path to the free cooling circuit heat absorbing heat exchanger, and a bypass flow path.

In some examples the coolant circuit flow paths are arranged such that all of the working fluid will flow sequentially through the heat absorbing heat exchangers of the refrigeration circuits. As will be understood from the above this will occur after flow in parallel through the free cooling circuit heat absorbing heat exchangers and/or the respective bypasses.

Working fluid in the coolant circuit passes through all of the refrigerant circuit heat absorbing heat exchangers, as well as being able to pass in parallel flows through the free cooling circuit heat absorbing heat exchangers. Typically there will be a single coolant circuit within the modular cooling system, i.e. a single coolant circuit for all of the plurality of chiller modules. It is beneficial to have parallel flows for free cooling as the cooling temperature range is constrained by the ability to reject heat in the free cooling circuit, for example by rejection of heat to the air. In each parallel flow path for free cooling the relevant portion of working fluid in the coolant circuit may thus be cooled toward the outside air temperature. The free cooling may provide all of the cooling required for some outside air temperature conditions, e.g. cooling by about 10° C. such as cooling from a return temperature of about 30° C. to a supply temperature of about 20° C. for a data center cooling application. Where the free cooling is not sufficient by itself, then mechanical cooling may be used in addition, and it will be appreciated that the use of a series connection of the refrigeration circuit heat exchangers then greater efficiency can be obtained when multiple refrigeration circuits are in operation. For example, where a 10° C. change in temperature is needed and the (parallel) free cooling heat exchangers can provide pre-cooling of 4° C., then it can be more efficient for the refrigeration circuits in two chiller modules to reduce the temperature of the combined flow by a first 3° C. reduction and a second 3° C. reduction than it may be to use parallel flows and a 6° C. temperature reduction. Or with three chiller modules then three steps of 2° C. reductions in series can increase efficiency over parallel heat exchangers each cooling a lesser amount of coolant by 6° C. Stated more generally, for a required temperature drop of X° C. (e.g. after free cooling) then each heat absorbing heat exchanger of the refrigeration circuits (connected in series) may provide a temperature drop of X/N° C., where N is the total number of chiller modules, with this being more efficient overall than the equivalent cooling provided by a parallel arrangement. In cases where free cooling is not possible, e.g. air temperatures not lower than the return coolant temperature, then the free cooling circuit heat absorbing heat exchangers can be bypassed and the refrigeration circuits can be use efficiently to provide the required cooling in sequential steps due to the series connection.

By way of further explanation on this issue, with units operating in mechanical mode (using refrigeration circuit) that are connected in parallel, then each of the unit's leaving coolant temperature (e.g. water temperature) should be identical. The refrigerant saturated temperature at compressor suction is then identical in each module (or units). (Refrigerant saturated temperature is lower than leaving water temperature typically by 0.5 to 4° C.) However, if units (or modules) operate in series, then only the latest unit in the series will have leaving a water temperature corresponding to the lowest temperature, i.e. that required by the system water temperature. All other units located upstream will have leaving water temperature(s) higher than the latest unit. As a consequence, the refrigerant saturated temperature at suction of compressors at upstream units will be a higher saturated suction temperature then saturated suction temperature of last unit (and higher than all units in case of parallel operation). Work provided by compressors in refrigerant circuit is reduced when the suction temperature is higher (saturated suction temperature is equivalent to refrigerant pressure). This means that total work provided by the compressors in multiple units (modules) will be lower in case of a serial configuration as proposed herein because the work of each compressor (with exception of the very last in a series) will be lower compared to the same compressor with a parallel configuration.

The working fluid for the coolant circuit may be a water-based fluid, i.e. primarily water and potentially with additives for reasons such as to help prevent freezing in case of "non-operation" when the ambient temperature is below ° C. . . . Typically this document refers just to "water" to describe such a working fluid. For many cooling applications water provides the required working temperature range, e.g. for providing cooling via cold water temperatures in the range 15 to 25° C., such as about 20° C. as is commonly used for space cooling or data center cooling. The coolant circuit may have a supply temperature in that range, with a return temperature that is 8 to 15° C. higher than the supply temperature. As noted above a 20° C. supply temperature and 30° C. return temperature is one possible example.

The free cooling circuits advantageously use a working fluid adapted for working at lower temperatures than the working fluid of the coolant circuit. Some examples use glycol as the working fluid in the free cooling circuits. The free cooling circuits may use a water-based working fluid, advantageously adapted for working at lower temperatures. In some cases it may be beneficial to operate below the freezing point of water, e.g. for use of low outside air temperatures for free cooling without prompting ice formation. Brine is a possible working fluid for some applications. The free cooling circuit may be designed to cope with working fluid temperatures dropping below 0° C., such as temperatures lower than 10° C. This could be an operating temperature, or it may be an expected low temperature that the free cooling circuit (or at least one part thereof) may be exposed to during periods of no operation.

The chiller modules each include two heat rejection heat exchangers, one for the refrigeration circuit and one for the free cooling circuit. The heat rejection heat exchangers may both reject heat to air. They may be arranged to use a common fan, i.e. a single fan for passing air over the heat rejection heat exchangers of both circuits. The heat rejection heat exchangers may in that case be arranged in series in relation to the movement of air, with the heat rejection heat exchanger of the free cooling circuit first, i.e. exposed to air at ambient temperatures, followed by the heat rejection heat exchanger of the refrigeration circuit, which may hence be exposed to air at a higher temperature. The fan speed may be variable in order to allow for control of the temperature change at the heat rejection heat exchangers. This fan speed may be controlled, e.g. via a control system as discussed below, based on the air temperature (typically outside air temperature, hence weather dependent) as well as based on the required cooling for the free cooling circuit and/or the refrigeration circuit.

The coolant circuit may comprise a coolant circuit pump, which may be a pump common to all flow paths within the coolant circuit. This may be a single coolant circuit pump located in a common flow path before flow is split to pass to each chiller module for the free cooling circuits thereof. Alternatively, or additionally, the coolant circuit may comprise multiple coolant circuit pumps, such as one pump for each chiller module, e.g. a coolant pump in each chiller module located on the coolant circuit flow path after the heat absorbing heat exchanger of the free cooling circuit, and before the flow paths recombine for flow of working fluid through the series connected heat absorbing heat exchangers of the refrigeration circuits The modular cooling system may comprise a control system for controlling the various parts thereof in order to control the cooling that is produced. The control system may be configured to operate each chiller module in one of three modes as discussed below in relation to the method aspect. The control system may comprise a controller for each chiller module or one or more controller(s) that each control multiple chiller modules.

The control system may for example be arranged to control fan speed for a fan of the heat rejection heat exchanger(s), which may be a common fan in each chiller module for provide airflow over both of the free cooling circuit heat rejection heat exchanger and the refrigeration circuit heat rejection heat exchanger. The control system may be configured to control fan speed in order to vary the heat transfer at the heat rejection heat exchanger(s).

The control system may be arranged to turn the chiller module refrigerant circuit compressor and/or free cooling circuit pump on or off, or to vary the speed of the compressor and/or pump. This may be done in order to vary the temperature change in the respective circuit at the heat rejection heat exchanger and/or at the heat absorbing heat exchanger.

The control system may be arranged to vary the flow rate and/or flow path of fluid flow within the coolant circuit, e.g. by controlling the pump(s) and/or bypass lines mentioned above.

The control system is advantageously configured to provide central control to match operation of the chiller modules and coolant circuit to cooling requirements and/or to increase efficiency for a given cooling output.

The refrigeration circuit(s) may include a condenser as the heat rejection heat exchanger and/or an evaporator as the heat absorbing heat exchanger. There may be other added elements within the refrigeration circuit(s) to provide benefits in terms of cooling capacity, efficiency and/or flexibility of operation, such as an economizer line for example. The refrigeration circuit(s) may include added components such as an accumulator or internal heat exchanger. The expansion device may be implemented in any suitable way, such as with an expansion valve. In examples where the expansion device has a controllable degree of expansion then the control system may be arranged to control the expansion device along with other controllable elements of the refrigeration circuit(s).

In the modular cooling system, the coolant circuit acts as a load for the chiller modules and provides cooling to satisfy a cooling demand. This cooling demand may for example be from a data center. Thus, the modular cooling system may be a cooling system for a data center. In example implementations, another aspect of the invention provides a data center comprising the modular cooling system for providing cooling to the data center.

Viewed from a further aspect the invention provides a method of providing cooling using a modular cooling system as discussed above, the method comprising: using the coolant circuit to cool a working fluid to meet a cooling demand; wherein each chiller module may be operated in a first mode, a second mode, or in a third mode; wherein in the first mode the chiller module is operated such that the working fluid is cooled in heat exchange with the heat absorbing heat exchanger of the free cooling circuit and further cooled in heat exchange with the heat absorbing heat exchanger of the refrigeration circuit; wherein in the second mode the chiller module is operated such that the working fluid is cooled in heat exchange with the heat absorbing heat exchanger of the free cooling circuit without any cooling from the heat absorbing heat exchanger of the refrigeration circuit; and wherein in the third mode the chiller module is operated such that the working fluid is cooled in heat exchange with the heat absorbing heat exchanger of the refrigeration circuit without any cooling from the heat absorbing heat exchanger of the free cooling circuit.

As the flow paths of the coolant circuit are arranged to connect the heat absorbing heat exchangers of the free cooling circuits in parallel and to connect the heat absorbing heat exchangers of the refrigeration circuits in series, then when all of the chiller modules are in the first mode the working fluid in the coolant circuit uses parts of the flow paths that split along parallel flows through the heat absorbing heat exchangers of the free cooling circuits before recombining to flow sequentially through the heat absorbing heat exchangers of the refrigeration circuits.

When at least one chiller module operates in the second mode then the working fluid of the coolant circuit may flow through the heat absorbing heat exchanger of the refrigeration circuit, in series with heat absorbing heat exchanger(s) of the refrigeration circuit(s) of the other chiller module(s), but without any cooling by the refrigeration circuit of the chiller module(s) that are in the second mode. Instead all of the cooling for that chiller module would be via heat exchange in the heat absorbing heat exchanger over the free cooling circuit. For example, the compressor of the refrigeration circuit may be turned off for the chiller module in the second mode. If all chiller modules are in the second mode then the working fluid may flow in the same parallel and then series flow paths as for the example where all chiller modules are in the first mode, but without any cooling from the heat absorbing heat exchangers of the refrigeration circuits.

When at least one chiller module operates in the third mode then the method may include use of a bypass so that the working fluid does not flow through the heat absorbing heat exchanger of the free cooling circuit, additionally or alternatively the method may include stopping the pump of the free cooling circuit.

A control system may be present as discussed above. This control system may be used to provide central control to place each chiller module in one of the first, second and third modes based on a cooling requirement. The method may also involve use of the control system to vary the cooling applied in the mode that is being used, such as by controlling one or more of a fan speed, a pump speed or a compressor speed.

The method may include controlling the flow of working fluid in the coolant circuit and/or controlling the chiller modules depending the required cooling such that there can be heat exchange with some or all of the heat absorbing heat exchangers in the various free cooling circuits and/or in the refrigeration circuits. The method may include deactivating one or more of the refrigeration circuit(s), e.g. by turning the compressor off, so that there is no cooling in the respective heat absorbing heat exchanger. The method may include adjusting the flow paths of the coolant circuit using a bypass for one or more of the free cooling circuit heat absorbing heat exchangers, optionally with each chiller module having a respective bypass. In configurations using a bypass then this may be controlled using one or more valves, such as a bypass valve on a bypass line, or a three-way valve connecting between an inlet flow path, a flow path to the free cooling circuit heat absorbing heat exchanger, and a bypass flow path.

The method may include using free cooling to provide all of the cooling required when the outside air temperature conditions permit adequate cooling. Where the free cooling is not sufficient by itself, then the method may comprise using additional cooling by means of one of more of the refrigeration circuits. When multiple refrigeration circuits are required then the method may include dividing the cooling load evenly between the sequential heat absorbing heat exchangers of the refrigeration circuits. Thus, as discussed above, when stated generally then for a required temperature drop of X degree C. (e.g. after free cooling) then the method may include using each heat absorbing heat exchanger of the refrigeration circuits (connected in series) to provide a temperature drop of X/N degree C., where N is the total number of chiller modules.

The method may include controlling the modular cooling system, e.g. via a control system as discussed above, so that it operates as set out above in relation to the first aspect or optional features thereof.

The heat rejection heat exchangers in one or more chiller modules may both reject heat to air and/or they may be arranged to use a common fan, i.e. a single fan for passing air over the heat rejection heat exchangers of both circuits, as described above. The method may include varying the fan speed in order to allow for control of the temperature change at the heat rejection heat exchangers. This fan speed may be controlled based on the air temperature (typically outside air temperature, hence weather dependent) as well as based on the required cooling for the free cooling circuit and/or the refrigeration circuit.

The method may include turning the chiller module refrigerant circuit compressor and/or free cooling circuit pump on or off, and/or varying the speed of the compressor and/or pump. This may be done in order to vary the temperature change in the respective circuit at the heat rejection heat exchanger and/or at the heat absorbing heat exchanger.

Certain embodiments will now be described by way of example only and with reference to the accompanying Figures, in which: FIG. 1 shows a first modular cooling system with two chiller modules; and FIG. 2 shows a second modular cooling system with three chiller modules.

Figure 2:
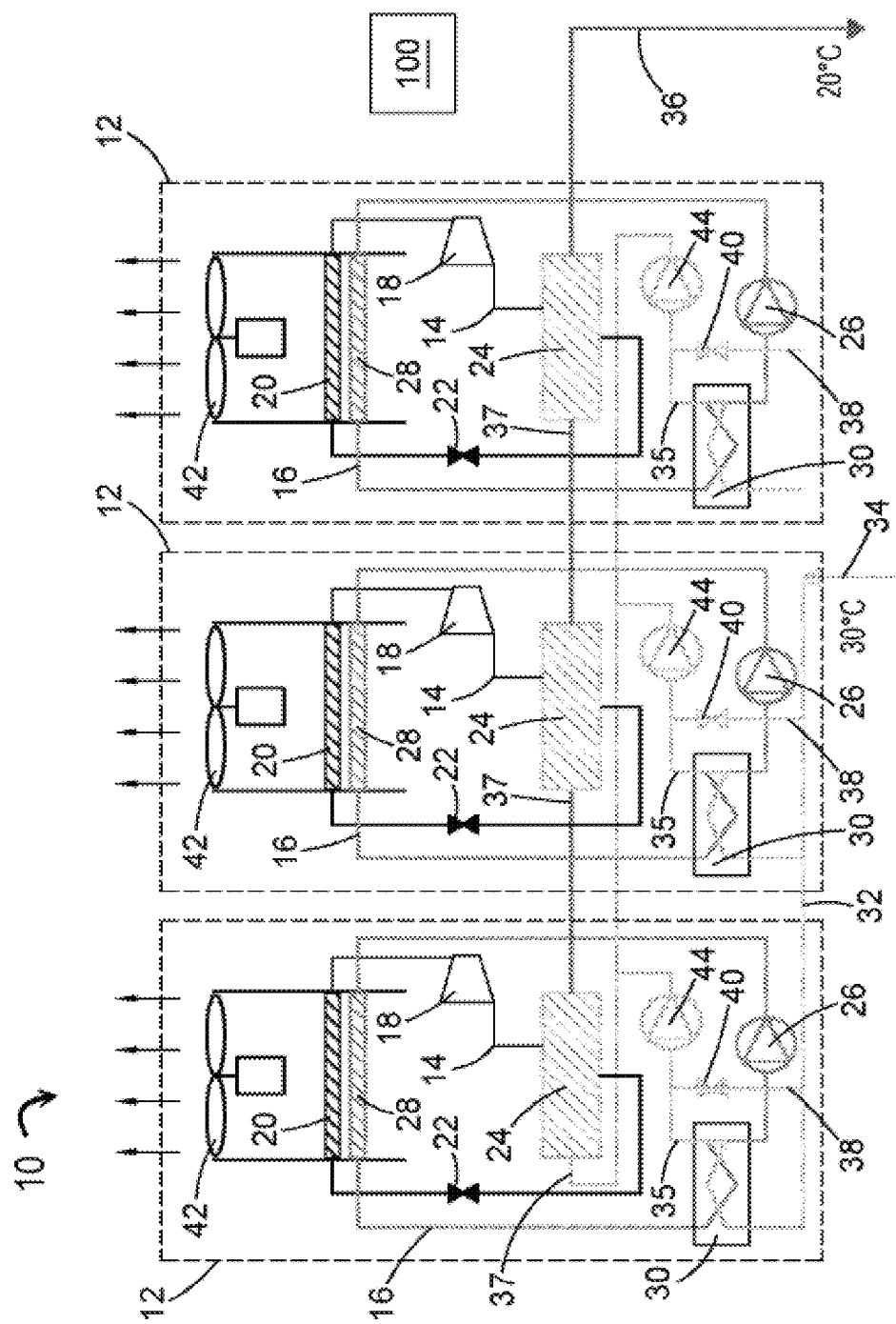
FIG. 2 shows a second modular cooling system with three chiller modules.

As shown in FIGS. 1 and 2, a modular cooling system 10 includes a plurality of chiller modules 12 each including: a refrigeration circuit 14 and a free cooling circuit 16. The refrigeration circuits comprise a compressor 18, a heat rejecting heat exchanger 20, an expansion device 22 and a heat absorbing heat exchanger 24. Each free cooling circuit comprises a pump 26, a heat rejecting heat exchanger 28 and a heat absorbing heat exchanger 30. The modular cooling system 10 also includes a coolant circuit 32 for cooling a working fluid to meet a cooling demand. The coolant circuit 32 receives hot fluid from an inlet 34 and provides cooler fluid via an outlet 36. In these examples the system is designed so that working fluid of the coolant circuit, which may be water or a water-based fluid, is received at 30° C. at the inlet 34 and cooled to 20° C. at the outlet 36. This temperature range has beneficial application for a computer data center cooling system. It will however be appreciated that the modular cooling system may be configured to work with other temperatures.

As seen in the Figures, the coolant circuit 32 includes flow paths having parts in each of the plurality of chiller modules 12, so that the working fluid can be cooled in heat exchange with the heat absorbing heat exchangers 30 of the free cooling circuits 16 and in heat exchange with the heat absorbing heat exchangers 24 of the refrigeration circuits 14. The flow paths of the coolant circuit 32 are arranged to connect the heat absorbing heat exchangers 30 of the free cooling circuits 16 in parallel and to connect the heat absorbing heat exchangers 24 of the refrigeration circuits 14 in series, such that the coolant circuit flow paths split along parallel flows 35 through the heat absorbing heat exchangers 30 of the free cooling circuits 16 before recombining to flow sequentially in a series flow path 37 through the heat absorbing heat exchangers 24 of the refrigeration circuits 14.

In FIG. 1 there are two chiller modules 12 and in FIG. 2 there are three chiller modules 12. It will be appreciated that further chiller modules 12 can be added, with the fourth and any further chiller module(s) 12 having the same connections in parallel and series to the coolant circuit 32.

A control system 100 is provided to control the modular cooling system 10. Depending on the required cooling this control may involve may be heat exchange with some or all of the heat absorbing heat exchangers 30, 24 in the various free cooling circuits 16 and refrigeration circuits 14. In some instances it will of course be the case that one or more refrigeration circuit(s) 14 are inactive, such as with the control system 100 turning off their compressor 18. In other instances, one or more of the free cooling circuits 16 may not provide any cooling. This may be achieved by the control system 100 turning off the pump 26 of the free cooling circuit and/or a bypass 38 may be used, as shown in the example Figures. The bypasses 38 are flow paths in the cooling circuit 32 that allow fluid to bypass the free cooling circuit heat absorbing heat exchangers 30. The control system 100 can control operation of the bypasses 38 by means of a bypass valve 40 on the bypass line. Alternatively, the same may be achieved by a three-way valve connecting between an inlet flow path from the coolant circuit inlet 32, a flow path to the free cooling circuit heat absorbing heat exchanger 30, and the bypass flow path 38. It will be understood that various configurations can provide the same bypass effect.

Working fluid in the coolant circuit 32 thus passes through all of the refrigerant circuit heat absorbing heat exchangers 24, as well as being able to pass in parallel flows through some or all the free cooling circuit heat absorbing heat exchangers 30. In the free cooling circuits, when temperature conditions permit it, cooling can be obtained via the free cooling circuit heat rejecting heat exchanger 28. Typically, this is arranged for heat exchange with outside air. Advantageously the chiller modules 12 have a fan 42 that provides for series air flow first across the free cooling circuit heat absorbing heat exchanger 28 and then across the refrigerant circuit heat absorbing heat exchanger 20. Via heat exchange with the free cooling circuit in the free cooling circuit heat absorbing heat exchangers 30 the working fluid in the respective parallel flow path of the coolant circuit 32 may thus be cooled toward the outside air temperature. The free cooling may provide all of the cooling required during some outside air temperature conditions, e.g. with outside air temperature sufficiently lower than 20° C. the modular cooling system can use free cooling alone to provide cooling by about 10° C. from a return temperature of about 30° C. to a supply temperature of about 20° C. Where the free cooling is not sufficient by itself, then mechanical cooling may be used in addition, via the control system 100 activating one or more of the refrigeration circuits 14.

When mechanical cooling from a plurality of chiller modules 12 is needed then the use of a series connection of the refrigeration circuit heat absorbing exchangers 24 leads to greater efficiency since each heat exchanger 24 in series is only required to provide a proportion of the temperature change for the working fluid in the coolant circuit 32. For example, where a 10° C. change in temperature is needed and the (parallel) free cooling heat exchangers 30 can provide pre-cooling of 4° C., then it can be more efficient for the refrigeration circuits 14 of two chiller modules 12 to reduce the temperature of the combined flow by a first 3° C. reduction and a second 3° C. reduction than it may be to use parallel flows and a 6° C. temperature reduction. In cases where free cooling is not possible, e.g. air temperatures not lower than the return coolant temperature, then the free cooling circuit heat absorbing heat exchangers 30 can be bypassed and the refrigeration circuits 12 alone can be use efficiently to provide the required cooling in sequential steps due to the series connection.

It will be appreciated that the option for free cooling and/or mechanical cooling in each of the chiller modules 12 means that each chiller module 12 may be operated in a first mode, a second mode, or in a third mode as discussed above. In the first mode the working fluid is cooled in heat exchange with the heat absorbing heat exchanger 30 of the free cooling circuit 16 and further cooled in heat exchange with the heat absorbing heat exchanger 24 of the refrigeration circuit 14. In the second mode the chiller module 12 is operated such that the working fluid is cooled in heat exchange with the heat absorbing heat exchanger 30 of the free cooling circuit 16 without any cooling from the heat absorbing heat exchanger 24 of the refrigeration circuit 14. In the third mode the chiller module 12 is operated such that the working fluid is cooled in heat exchange with the heat absorbing heat exchanger 24 of the refrigeration circuit 14 without any cooling from the heat absorbing heat exchanger 30 of the free cooling circuit 16. The control system 100 may be configured to switch each chiller module 12 between modes as well as to vary the cooling within a particular mode, such as by control of one or more the heat rejection heat exchanger fan 42, the refrigeration circuit compressor 18 and/or the free cooling circuit pump 26.

The free cooling circuit 16 uses a free cooling working fluid, which is advantageously a different fluid to the working fluid of the coolant circuit 32. The free cooling circuit 16 should operate at a lower temperature than the coolant circuit 32 in order to provide free cooling. One possible fluid for the free cooling circuit is glycol. Thus, each chiller module 12 may have a glycol free cooling circuit 16 whilst the modular cooling system 10 can have a single water coolant circuit 32 that interconnects all of the chiller modules 12.

The coolant circuit 32 may comprise at least one coolant circuit pump 44. In some examples there is a single coolant circuit pump 44 located in a common flow path, e.g. at inlet 32, before flow is split to pass to each chiller module 12 for the free cooling circuits 16 thereof. Alternatively, or additionally, and as shown in the Figures, the coolant circuit 32 may comprise multiple coolant circuit pumps 44, with one pump 44 for each chiller module 12 located on the parallel part of the coolant circuit flow path 35 after the heat absorbing heat exchanger 30 of the free cooling circuit 16, as well as after the bypass 30, and before the flow paths recombine for flow of working fluid through the series connected heat absorbing heat exchangers 24 of the refrigeration circuits 14.

The refrigeration circuits 14 may include a condenser as the heat rejection heat exchanger 20 and/or an evaporator as the heat absorbing heat exchanger 24. There may be other added elements within the refrigeration circuits 14 to provide benefits in terms of cooling capacity, efficiency and/or flexibility of operation, such as an economizer line for example. The refrigeration circuits 14 can include added components such as an accumulator or internal heat exchanger. The expansion device 22 may be implemented in any suitable way, such as with an expansion valve 22. In examples where the expansion device 22 has a controllable degree of expansion then the control system 100 can be arranged to control the expansion device 22 along with other controllable elements of the refrigeration circuits 14, the free cooling circuits 16 and the coolant circuit 32.

The system may also have other elements on the refrigerant side such as an oil separator and/or a filter drier. On the coolant (e.g water) side there can additionally be an expansion vessel as well as valves, filters and so on, such as may be known for existing water coolant loops in hydronic cooling systems. The modular cooling system will typically also include temperature and/or pressure sensors at various points, as is known in the art, such as in order to allow the control system 100 to monitor operation of the system and control it according to user requirements.

It will be appreciated that the coolant circuit 32 acts as a load for the chiller modules 12 and provides cooling to satisfy a cooling demand. In an example implementation this cooling demand can be from a data center, so that the modular cooling system is a data center cooling system.

While the invention has been described in detail in connection with only a limited number of embodiments, it should be readily understood that the invention is not limited to such disclosed embodiments. Rather, the invention can be modified to incorporate any number of variations, alterations, substitutions, or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description but is only limited by the scope of the appended claims.

The invention claimed is:

1. A modular cooling system comprising:
a plurality of chiller modules each including: a refrigeration circuit and a free cooling circuit, wherein each refrigeration circuit comprises a compressor, a heat rejecting heat exchanger, an expansion device and a heat absorbing heat exchanger, and wherein each free cooling circuit comprises a pump, a heat rejecting heat exchanger and a heat absorbing heat exchanger; and
a coolant circuit for cooling a working fluid to meet a cooling demand;
wherein the coolant circuit includes flow paths having parts in each of the plurality of chiller modules whereby the working fluid can be cooled in heat exchange with the heat absorbing heat exchangers of the free cooling circuits and heat exchange with the heat absorbing heat exchangers of the refrigeration circuits; and
wherein the flow paths of the coolant circuit are arranged to connect the heat absorbing heat exchangers of the free cooling circuits in parallel and to connect the heat absorbing heat exchangers of the refrigeration circuits in series, such that the coolant circuit flow paths split along parallel flows through the heat absorbing heat exchangers of the free cooling circuits before recombining to flow sequentially through the heat absorbing heat exchangers of the refrigeration circuits.

2. A modular cooling system as claimed in claim 1, wherein there are three or more chiller modules.

3. A modular cooling system as claimed in claim 1, wherein flow paths of the coolant circuit include a bypass for one or more of the free cooling circuit heat absorbing heat exchangers.

4. A modular cooling system as claimed in claim 3, wherein the coolant circuit flow paths are arranged such that all of the working fluid will flow sequentially through the heat absorbing heat exchangers of the refrigeration circuits after flow in parallel through the free cooling circuit heat absorbing heat exchangers and/or the respective bypasses.

5. A modular cooling system as claimed in claim 1, wherein the chiller modules are configured to provide cooling to the coolant circuit to reduce the working fluid temperature by about 10° C. such as cooling from a return temperature of about 30° C. to a supply temperature of about 20° C.

6. A modular cooling system as claimed in claim 1, wherein for a required temperature drop of X° C. then each heat absorbing heat exchanger of the refrigeration circuits is configured to provide a temperature drop of X/N° C., where N is the total number of chiller modules.

7. A modular cooling system as claimed in claim 1, wherein the free cooling circuits use a working fluid adapted for working at lower temperatures than the working fluid of the coolant circuit.

8. A modular cooling system as claimed in claim 1, wherein in each chiller module the heat rejection heat exchangers of the refrigeration circuit and the free cooling circuit both reject heat to air and the chiller module comprises a single fan for passing air over both of the heat rejection heat exchangers; and wherein the heat rejection heat exchangers are arranged in series in relation to the movement of air, with the heat rejection heat exchanger of the free cooling circuit located upstream in the air flow path compared to the heat rejection heat exchanger of the refrigeration circuit.

9. A modular cooling system as claimed in claim 1, wherein the coolant circuit comprises a coolant circuit pump common to all flow paths within the coolant circuit.

10. A modular cooling system as claimed in claim 1, wherein the coolant circuit comprises multiple coolant circuit pumps, including one pump for each chiller module wherein this one pump is located on the coolant circuit flow path in the chiller module after the heat absorbing heat exchanger of the free cooling circuit and before the flow paths recombine for flow of working fluid through the series connected heat absorbing heat exchangers of the refrigeration circuits.

11. A modular cooling system as claimed in claim 1, comprising a control system for controlling the various parts thereof in order to control the cooling that is produced.

12. A modular cooling system as claimed in claim 11, wherein the control system is arranged to turn the chiller module refrigerant circuit compressor and/or free cooling circuit pump on or off, or to vary the speed of the compressor and/or pump in order to vary the temperature change in the respective circuit at the heat rejection heat exchanger and/or at the heat absorbing heat exchanger.

13. A method of providing cooling using a cooling system as claimed in claim 1, the method comprising:
using the coolant circuit to cool a working fluid to meet a cooling demand;
wherein each chiller module may be operated in a first mode, a second mode, or in a third mode;
wherein in the first mode the chiller module is operated such that the working fluid is cooled in heat exchange with the heat absorbing heat exchanger of the free cooling circuit and further cooled in heat exchange with the heat absorbing heat exchanger of the refrigeration circuit;
wherein in the second mode the chiller module is operated such that the working fluid is cooled in heat exchange with the heat absorbing heat exchanger of the free cooling circuit without any cooling from the heat absorbing heat exchanger of the refrigeration circuit; and
wherein in the third mode the chiller module is operated such that the working fluid is cooled in heat exchange with the heat absorbing heat exchanger of the refrigeration circuit without any cooling from the heat absorbing heat exchanger of the free cooling circuit.

14. A method as claimed in claim 13, comprising using a control system to provide central control in order to place each chiller module in a selected one of the first, second and third modes based on a cooling requirement, optionally wherein the method comprises use of the control system to vary the cooling provided by the chiller module in the selected mode by controlling one or more of a fan speed, a pump speed or a compressor speed.

15. The modular cooling system of claim 1, wherein the flow paths of the coolant circuit are further arranged such that the coolant circuit flow paths split along parallel flows through the heat absorbing heat exchangers of the free cooling circuits before recombining to flow sequentially through the heat absorbing heat exchangers of the refrigeration circuits.

16. A data center cooling system comprising a modular cooling system having a plurality of chiller modules each including: a refrigeration circuit and a free cooling circuit, wherein each refrigeration circuit comprises a compressor, a heat rejecting heat exchanger, an expansion device and a heat absorbing heat exchanger, and wherein each free cooling circuit comprises a pump, a heat rejecting heat exchanger and a heat absorbing heat exchanger; and a coolant circuit for cooling a working fluid to meet a cooling demand;

wherein the coolant circuit includes flow paths having parts in each of the plurality of chiller modules whereby the working fluid can be cooled in heat exchange with the heat absorbing heat exchangers of the free cooling circuits and heat exchange with the heat absorbing heat exchangers of the refrigeration circuits; and wherein the flow paths of the coolant circuit are arranged to connect the heat absorbing heat exchangers of the free cooling circuits in parallel and to connect the heat absorbing heat exchangers of the refrigeration circuits in series, such that the coolant circuit flow paths split along parallel flows through the heat absorbing heat exchangers of the free cooling circuits before recombining to flow sequentially through the heat absorbing heat exchangers of the refrigeration circuits.

17. A data center cooling system as claimed in claim 16, wherein there are three or more chiller modules.

18. A data center cooling system as claimed in claim 16, wherein flow paths of the coolant circuit include a bypass for one or more of the free cooling circuit heat absorbing heat exchangers.

19. A data center cooling system as claimed in claim 18, wherein the coolant circuit flow paths are arranged such that all of the working fluid will flow sequentially through the heat absorbing heat exchangers of the refrigeration circuits after flow in parallel through the free cooling circuit heat absorbing heat exchangers and/or the respective bypasses.

20. A modular cooling system comprising:

a plurality of chiller modules each including: a refrigeration circuit and a free cooling circuit, wherein the refrigeration circuit and the free cooling circuit comprise at least a heat absorbing heat exchanger;

a coolant circuit for cooling a working fluid in each of the plurality of chiller modules; and wherein the flow paths of the coolant circuit are arranged to connect heat absorbing heat exchangers of the free cooling circuits in parallel and to connect the heat absorbing exchangers in series.

* * * * *